United States Patent [19]

Häckel et al.

[11] Patent Number: 4,719,433

[45] Date of Patent: Jan. 12, 1988

[54] ATTENUATION BEAD FOR THE SUPPRESSION OF INTERFERENCE RADIATION

[75] Inventors: Hans Häckel; Josef Schindler, both of Regensburg, Fed. Rep. of Germany

[73] Assignee: Siemens Aktiengesellschaft, Berlin and Munich, Fed. Rep. of Germany

[21] Appl. No.: 761,236

[22] Filed: Jul. 31, 1985

[30] Foreign Application Priority Data

Sep. 14, 1984 [DE] Fed. Rep. of Germany ....... 3433831

[51] Int. Cl.⁴ .................... H03H 7/00; H03H 7/24
[52] U.S. Cl. .................... 333/12; 333/81 R; 333/181; 333/185
[58] Field of Search .............. 333/12, 24 R, 24 C, 333/81 R, 167, 181–185; 336/83, 110, 175, 212, 214, 216, 223

[56] References Cited

U.S. PATENT DOCUMENTS

| 3,781,724 | 12/1973 | Moore et al. | 333/182 |
| 3,939,444 | 2/1976 | Hollyday et al. | 333/182 |
| 3,987,380 | 10/1976 | Hudson, Jr. | 333/181 |
| 4,212,510 | 7/1980 | Ritchie et al. | 333/183 X |
| 4,374,369 | 2/1983 | Sakamoto et al. | 333/182 |
| 4,571,561 | 2/1986 | Fujiki et al. | 333/185 X |

Primary Examiner—Marvin L. Nussbaum
Attorney, Agent, or Firm—John Francis Moran

[57] ABSTRACT

An attenuation bead is disclosed with a tube (1) made of ferrite suitable for use as a chip component. The attenuation bead is equipped with frontal contact elements (2) which are electrically corrected with one another by conductor elements (4) in the interior of the tube. The operating range of interference suppression for the attenuation beads is in the short-wave and ultra short-wave frequency bands.

2 Claims, 8 Drawing Figures

ATTENUATION BEAD FOR THE SUPPRESSION OF INTERFERENCE RADIATION

BACKGROUND OF THE INVENTION

This invention relates to an attenuation bead for the suppression of interference radiation, and, in particular, it relates to a ferrite tube for suppressing interference in the short-wave and ultra short-wave range.

Conventional attenuation beads made of ferrite according to the foregoing kind have long been known and are suitable in particular in the short-wave and ultra short-wave bands of frequency use. Placed over a conductor, the attenuation beads produces an attenuation which increases with the number of beads. Premagnetization of the attenuation beads reduces the attenuation.

It is an object of the invention to provide an attenuation bead in clip form which is suitable for loading into a magazine and consequently for use in insertion machines for instance for printed circuits.

SUMMARY OF THE INVENTION

The invention takes the form of an attenuation bead shaped as a chip component with frontal contact elements which are electrically coupled with one another by conductor elements inside a tube.

The frontal contact elements are formed, for example, as metallized end faces coated with soft solder. The conductor elements themselves may also consist of a suitable soft solder, preferably in particular high melting point soft solder, or of a metal layer applied on the inner walls of the tube.

As conductor elements also wires are suitable which are passed through the interior of the tube, brought out at the end faces of the attenuation bead in crank fashion, and flattened at their ends. The flattened ends may also be guided in the direction of the tube.

The attenuation beads thus formed, possibly sheathed in block form with sealing compound, e.g. epoxy resin, are preferably magazined and as such are suitable for use in insertion machines for printed circuits.

BRIEF DESCRIPTION OF THE DRAWING

Additional objects, features and advantages of the invention including its implementation and operational applications will best be understood from the following detailed description taken in conjunction with the accompanying drawing, wherein.

DETAILED DESCRIPTION

Figure 1:
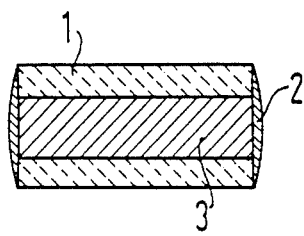
FIG. 1 shows a longitudinal cross-sectional view of a first illustrative embodiment.
Figure 2:
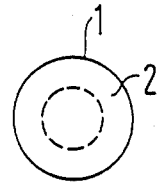
FIG. 2 is a side view of the attenuation bead of FIG. 1.

The chip component suitable as attenuation bead shown in FIGS. 1 and 2 has a tube 1 made of ferrite whose interior is filled, after metallization, with high melting soft solder 3. The ends of soft solder 3 are in electrically conducting connection with soft solder layers 2 which are applied on the end walls of the tube by a conventional method.

These attenuation beads formed as chip components can be supplied as bulk material or in magazines, e.g. belted. Their marking with the respective attenuation values may be provided by appropriately applied color dots, color strips, color rings and, if the size is suitable, also by appropriate imprints.

Figure 3:
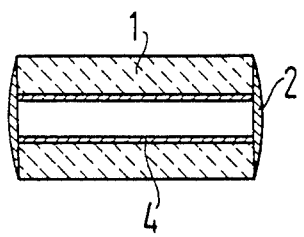
FIGS. 3 and 4 show, in general accordance with FIGS. 1 and 2, a second illustrative embodiment of the invention.
Figure 4:
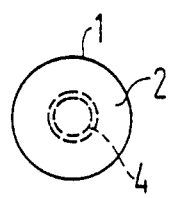

In a second illustrative embodiment according to FIGS. 3 and 4, the soft solder 3 per FIG. 1, 2 is replaced by a metal layer 4 which covers the inner walls of the tube and electrically connects the frontal soft solder layers.

Figure 5:
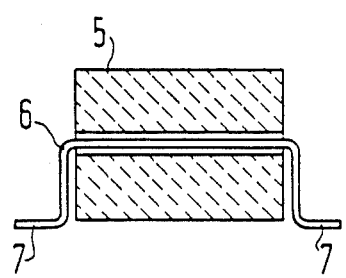
FIG. 5, in partial sectional view, is a third illustrative embodiment of the invention.
Figure 6:
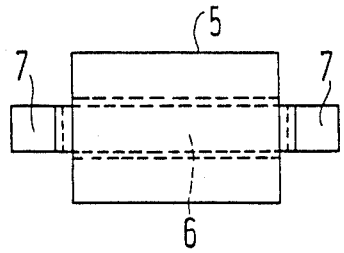
FIG. 6 is a plane view of the attenuation bead of FIG. 5.

In a third illustrative embodiment according to FIGS. 5 and 6, the soft solders and metal layers according to FIGS. 1 through 4 are replaced by a metal strip 6. At the one end faces of a possibly parallelpiped shaped ferrite body 5, this metal strip is brought out in crank fashion, i.e. bent at right angles twice, and is flattened at its ends 7. When ferrite body is parallelepiped shaped, the side view of the end of ferrite body 7 (not shown) would have a rectangular or possibly square profile. By using these ends 7 the attenuation beads are soldered on, e.g. on conductor tracks of printed circuit boards.

Figure 7:
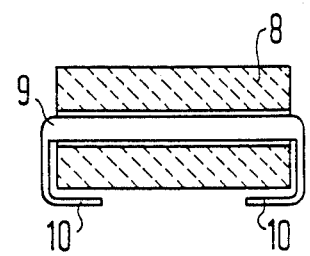
FIGS. 7 and 8, in general accordance with FIGS. 5 and 6 depicts a fourth illustrative embodiment of the invention.
Figure 8:
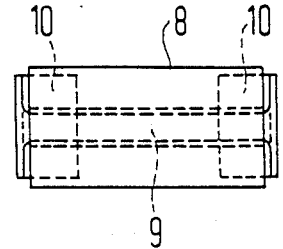

In the attenuation bead illustrated by FIGS. 7 and 8, which, too, may have a parallelpiped shaped ferrite tube 8, a wire 9 is brought out at both end faces of tube 8 also, but its flattened ends 10 are bent inward to face each other and parallel to tube 8.

There has thus been shown and described a novel attenuation bead which fulfills all the objects and advantages sought therefor. Many changes, modifications, variations and other uses and applications of the subject invention will, however, become apparent to those skilled in the art after considering this specification and the accompanying drawings which disclose preferred embodiment thereof. All such changes, modifications, variations and other uses and applications which do not depart from the spirit and scope of the invention are deemed to be covered by the invention which is limited only by the claims which follow.

What is claimed is:

1. An attenuation bead for the suppression of interference radiation, in particular in the short-wave and ultra short-wave radio frequency range, in the form of a chip component, which due to its physical form is loadable in a magazine, the attenuation bead comprising a tubular ferrite body having end faces and a hollow interior extending through the body, the end faces of the ferrite body are metallized and covered with a soft solder, the inner wall of the hollow interior is metallized and the hollow interior of the body is filled with soft solder, and the soft solders on the end faces are electrically connected together via the filling of soft solder.

2. An attenuation bead for the suppression of interference radiation, in particular in the short-wave and ultra short-wave radio frequency range, in the form of a chip component, which due to its physical form is suitable for loading in a magazine, the attenuation bead comprising a tubular ferrite body having end faces and a hollow interior extending through the ferrite body, the end faces of the ferrite body are metallized and covered with a soft solder, and the inner wall of the hollow interior is coated with a metal layer which electrically connects the soft solders on the end faces with one another.

* * * * *